United States Patent
Huang et al.

(10) Patent No.: US 6,208,146 B1
(45) Date of Patent: Mar. 27, 2001

(54) METHOD AND APPARATUS FOR MEASURING CONTACT RESISTANCE FOR SPOT WELDING SIMULATIONS

(75) Inventors: Ningjian Huang, Rochester Hills; Pei-Chung Wang, Troy, both of MI (US)

(73) Assignee: General Motors Corporation, Detroit, MI (US)

(*) Notice: Subject to any disclaimer, the term of this patent is extended or adjusted under 35 U.S.C. 154(b) by 0 days.

(21) Appl. No.: 09/246,305

(22) Filed: Feb. 8, 1999

(51) Int. Cl.[7] ................................................. G01R 27/04
(52) U.S. Cl. ................................. 324/421; 219/109
(58) Field of Search .......................... 324/703, 691, 324/713, 421; 219/109

(56) References Cited

U.S. PATENT DOCUMENTS

| | | | |
|---|---|---|---|
| 3,654,424 | * 4/1972 | Vanderhelst | 219/108 |
| 4,497,994 | * 2/1985 | Flemm et al. | 219/109 |
| 5,021,625 | * 6/1991 | Destefan et al. | 219/109 |
| 5,260,668 | * 11/1993 | Mallory et al. | 324/719 |
| 5,977,505 | * 11/1999 | Kobayyashi et al. | 219/91.2 |

* cited by examiner

*Primary Examiner*—Safet Metjahic
*Assistant Examiner*—Vincent Q. Nguyen
(74) *Attorney, Agent, or Firm*—George A. Grove

(57) ABSTRACT

A method and apparatus for measuring the contact resistance at electrode-to-workpiece and workpiece-to-workpiece interfaces for spot welding simulations. A constant compressive load is applied through electrodes and workpieces to simulate a load applied during an actual resistance spot welding process. A discharging current circuit applies an initial high current of the order of 1.2 KA to electrodes and workpieces to break down contaminant films on surfaces of the workpieces. A relatively small constant current of about 2A is then applied to the electrodes and workpieces and the voltage across and the current flow through the electrodes and workpieces are measured. The contact resistance is determined from the measured voltage and current.

7 Claims, 3 Drawing Sheets

METHOD AND APPARATUS FOR MEASURING CONTACT RESISTANCE FOR SPOT WELDING SIMULATIONS

TECHNICAL FIELD

This invention relates to resistance spot welding simulations and more particularly to a method and apparatus for measuring contact resistance for spot welding simulations.

BACKGROUND OF THE INVENTION

The resistance spot welding process is commonly used to make spot welds to join sheet metal parts. For example, thousands of spot welds are used in assembling the automobile. Therefore, improving the resistance spot welding characteristics has direct impact on the cost as well as the quality of automotive productions. Electrical contact resistance at electrode-to-sheet metal and sheet-to-sheet metal interfaces is an important characteristic to determine in order to optimize the welding process. There are currently two methods used to obtain electrical contact resistance measurements. One method is called an on-line approach, and the other one is called an off-line approach. The on-line approach indirectly monitors the variation of contact resistance during the real spot welding process. A problem with the on-line approach is that because there is an increase in heat locally, it is difficult to obtain the contact resistance property at a controlled temperature.

The off-line approach measures the contact resistance by simulating conditions during the real process, such as temperature and compressive load. A small current, as typically used in multimeter measurements, is used to measure the resistance in the off-line approach. A problem with the off-line approach is that, because of the existence of surface oxide or contaminant film, the measurements are strongly dependent upon the surface conditions and thus measurements are often inaccurate.

SUMMARY OF THE INVENTION

The present invention is directed to a method and apparatus for accurately measuring the contact resistance between electrode-to-workpiece and workpiece-to-workpiece interfaces by eliminating the problems associated with varying temperatures and contaminant films on surfaces of workpieces to be welded. The method of the invention includes applying a constant compressive load through electrodes and workpieces to simulate a load applied during an actual resistance spot welding process. The electrodes and workpieces are maintained at a constant temperature. A high current of, e.g., 1.2 KA is applied to the workpieces to break down contaminant films on surfaces of the workpieces. By breaking down the films, a more accurate reproducible measurement of contact resistance is obtained. Then a small current of, e.g., 2A is applied to the electrodes and workpieces and the voltage drop across and the current flow through the electrodes and workpieces is measured. From the voltage and current measurements, the contact resistance is determined.

The apparatus of the present invention includes a heating system, cooling system, loading system, discharging current circuit and resistance measuring system. The apparatus is capable of measuring contact resistance under different load and temperature conditions. The heating system maintains the desired temperature conditions for the measurements. The cooling system prevents the heater from overheating and cools the electrodes. A compressive load is applied to the electrodes and workpieces in order to simulate the load applied during resistance spot welding. The discharging current circuit is connected across the electrodes and applies an initial high current (suitably 1.2 KA) through the electrodes and workpieces to eliminate the contaminant film on the surfaces of the workpieces. Resistance measurement is achieved by applying a small current (suitably 2A) through the electrodes and workpieces and then measuring the voltage drop across the electrodes and workpieces. Then, the contact resistance can be determined from the measured voltage across and the current through the electrodes and workpieces.

These and other features and advantages of the invention will be more fully understood from the following description of a certain specific embodiment of the invention taken together with the accompanying drawings.

DESCRIPTION OF THE PREFERRED EMBODIMENT

Figure 1:
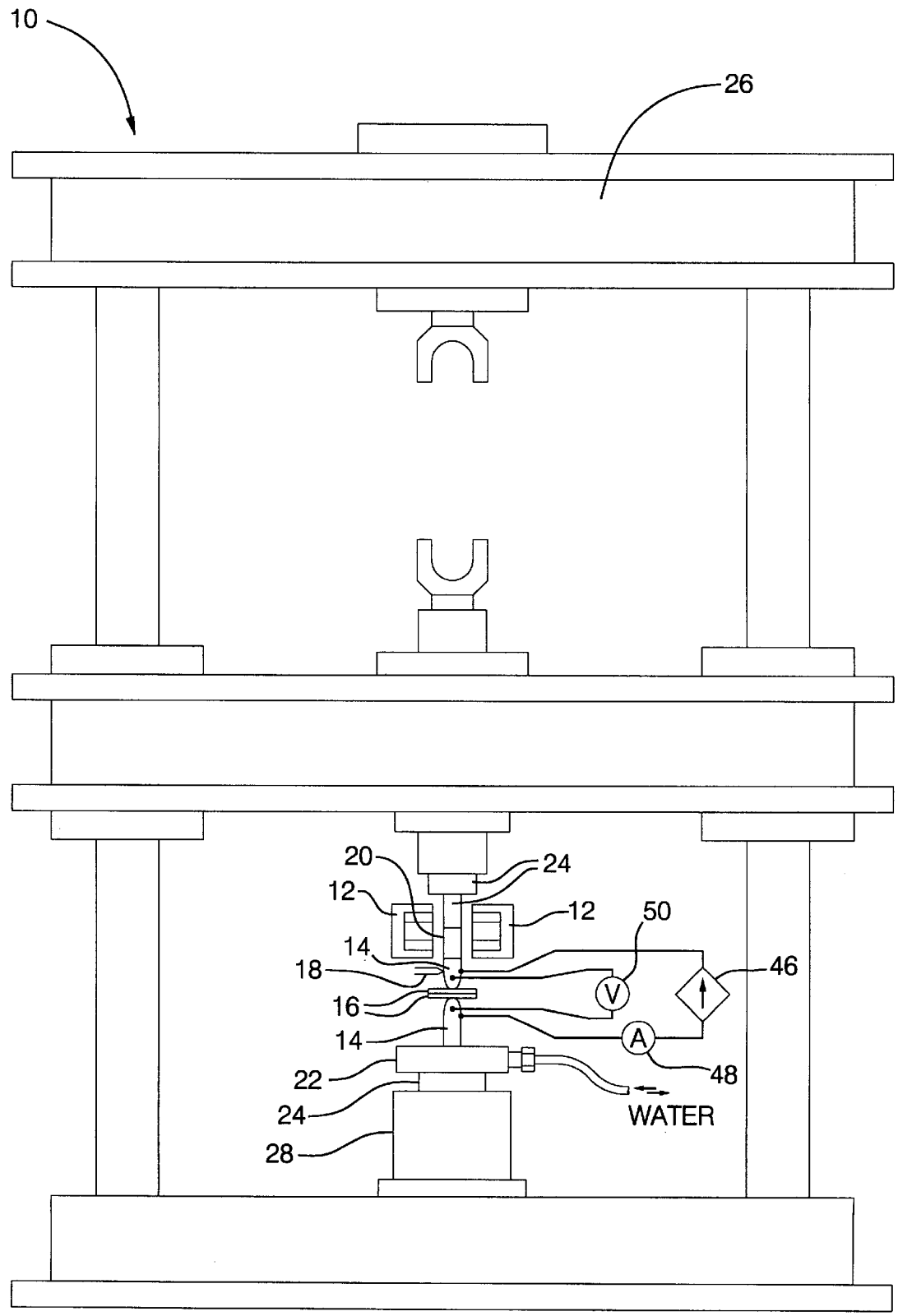
FIG. 1 is a side view of a Instron loading machine as used in the present invention.

Referring now to the drawings in detail, numeral 10 generally indicates an apparatus for measuring the contact resistance for spot welding simulations. To optimize the welding schedules for resistance spot welding, the electrical contact resistance at electrode-to-workpiece and workpiece-to-workpiece interfaces is needed. Referring to FIG. 1, the apparatus 10 includes a heating system, cooling system, loading system, discharging current circuit and resistance measuring system. The heating system includes a multizone heater 12 such as a focused infrared multizone heater. The multizone heater 12 has three pairs of quartz lamps which can output 3 kW maximum power. The electrical power for the multizone heater 12 is supplied by three silicon controlled rectifier (SCR) power controllers, which are controlled by an integrated logic and control system (not shown). The temperature is controlled by feeding back a temperature signal from a thermocouple 18 welded on one of the electrodes 14 to the integrated logic and control system. The integrated logic and control system can then apply a command signal to the SCR power controller. Then, the proper power is supplied to the multizone heater to generate the desired temperature. To heat the electrodes and workpieces, the multizone heater heats a heating rod 20 which then heats the electrodes 14 and workpieces 16 by conduction.

The cooling system provides compressed air and cooling water to the multizone heater to prevent it from over-heating reflectors or breaking down seals of the heater. In addition to the water and compressed air required for the multizone heater 12, a cooling block 22 is placed under the electrodes 14 and workpieces 16. The cooling block 22 cools down the electrodes 14 and increases the temperature gradient. The cooling block 22 may be made of a solid copper block and drilled with a "U" shape conduit for water to pass through. Ceramic insulators 24 are placed on the heating rod 20 and under the cooling block 22 to insulate the heating area. The ceramic insulators 24 have to be able to sustain the maximum compressive load being applied to the electrodes 14 and workpieces 16.

To simulate the load applied during an actual resistance spot welding process a compressive load system is required. An Instron universal testing machine 26 may be used as the loading system. A compressive load cell 28 is used for monitoring the applied load. A voltage signal from the load cell 28 is filtered and amplified by a signal conditioner, and then the voltage signal is downloaded into a computer. A load/voltage curve of the load cell 28 has to be first calibrated with a known load and then the compressive load can be maintained approximately constant by maintaining the output voltage signal of the load cell 28 constant.

Figure 2:
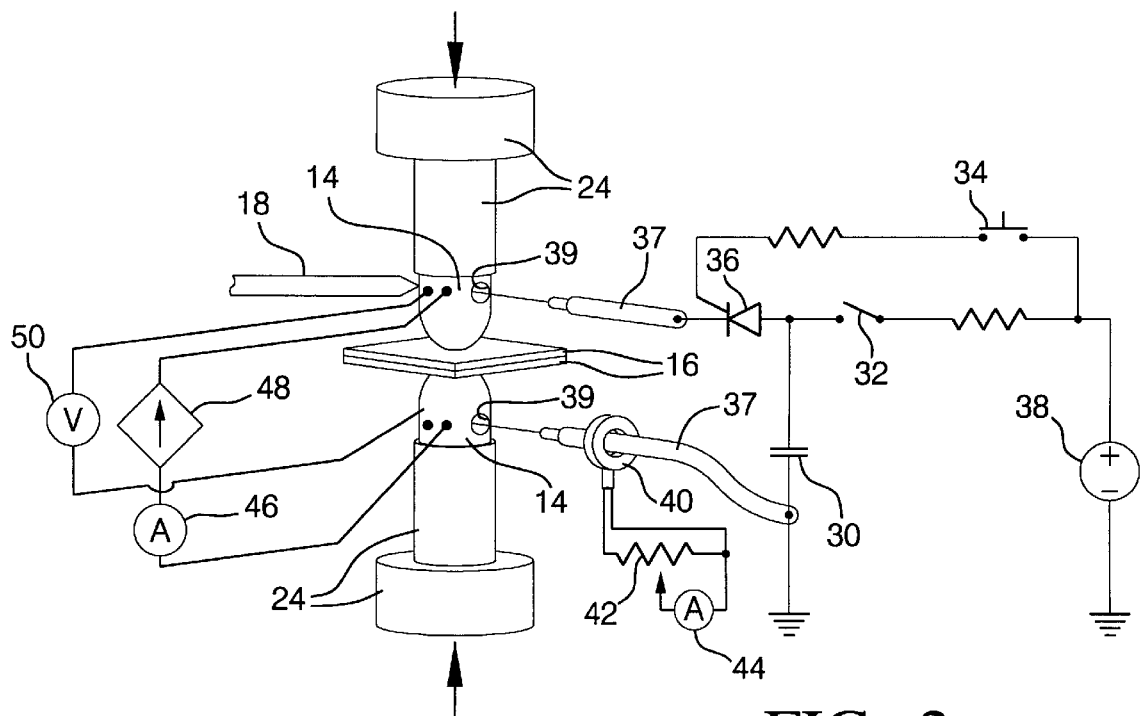
FIG. 2 is a pictorial view of a section of the apparatus and a schematic of a discharging current circuit connected to the section of the apparatus.
Figure 3:
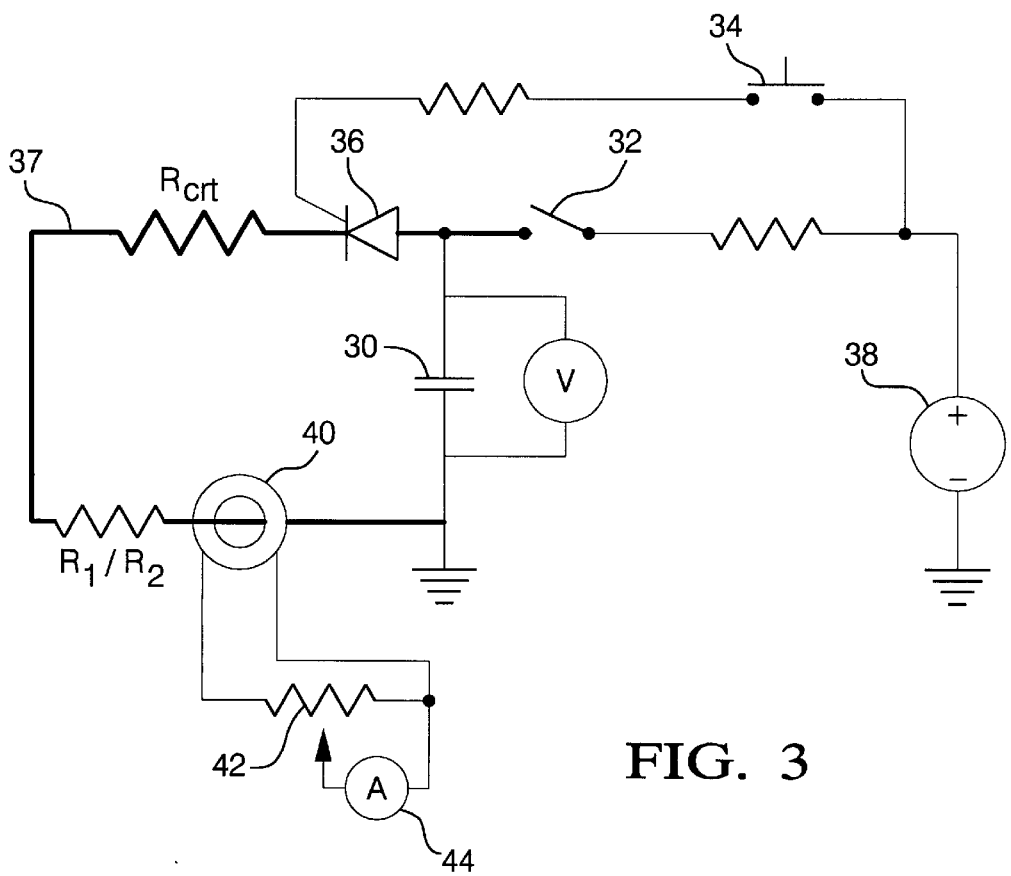
FIG. 3 is a schematic of the discharging current circuit.

Referring to FIGS. 2 and 3, the discharging current circuit is connected between the two electrodes and includes at least one capacitor 30, first and second switches 32, 34, high current switch 36, such as a thyristor, and voltage power supply 38. The power supply 38 is connected in parallel with the first and second switches 32, 34. The first switch 32 may be any type of electronic semiconductor switch and the second switch 34 may be a push button switch. The second switch 34 is connected to the gate of the thyristor 36. The first switch 32 is connected to the capacitor 30 and the anode of the thyristor 36. The capacitor 30 may be multiple capacitors in parallel. The cathode of the thyristor 36 is connected to the one of the electrodes 14. The other electrode is connected to ground.

To charge the capacitor 30, the first switch 32 is closed to connect the power supply 38 to the capacitor 30. The first switch 32 remains closed until a desired capacitor voltage is reached or until a high current can be supplied to the electrodes 14. For discharging the capacitor 30, the first switch 32 is opened and the second switch 34 is closed. By closing the second switch 34 the gate of the thyristor 36 is triggered and it fires the thyristor 36. A current of 1.23 KA is then discharged through the electrodes 14 and workpieces 16 for 350 microseconds to break down the contaminant film on the surfaces of the workpieces 16.

In order to obtain a higher discharging current, part of the circuit is connected with a 6-gauge welding cable 37 to reduce the circuit resistance ($R_{crt}$). The circuit resistance includes the resistance of the cable, thyristor, wire and cable joints. The thicker lines in FIG. 2 indicate the 6-gauge welding cable 37. The welding cables 37 are joined to the electrodes 14 by soldering. A hole 39 is drilled in each electrode 14 in order to connect the welding cable 37 to the electrodes 14. To allow the discharging current to be measured, a current transformer 40 with 0.1 V/1A conversion ratio is used. Then, the output of the current transformer 40 is reduced by a voltage divider 42 and recorded by a digital oscilloscope 44.

Figure 4:
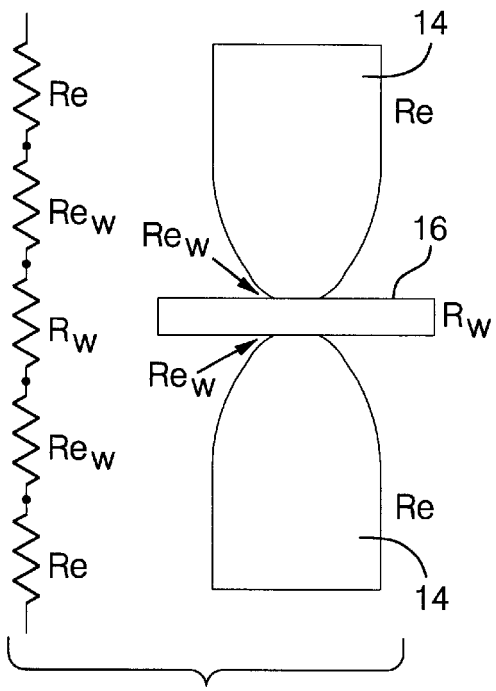
FIG. 4 is a side view of electrode-to-workpiece interfaces and corresponding resistances of the elements and resistances at their interfaces.
Figure 5:
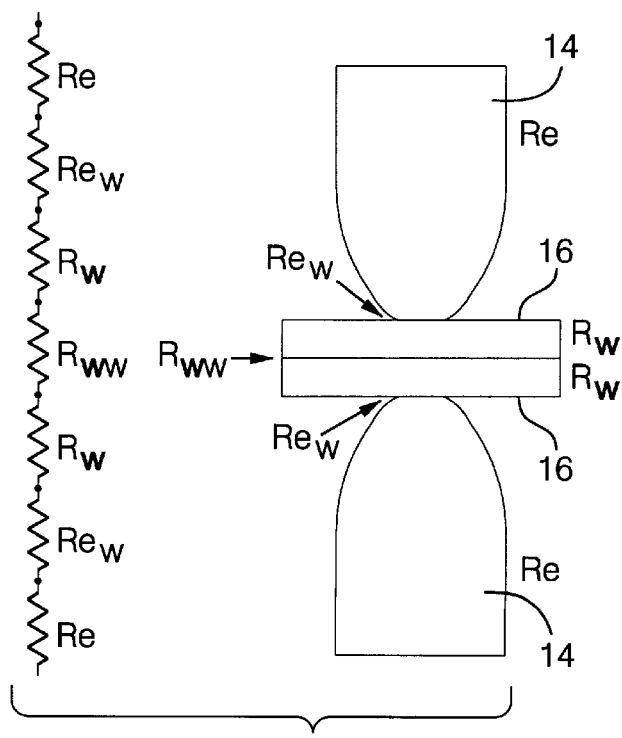
FIG. 5 is a side view of electrode-to-workpiece and workpiece-to-workpiece interfaces and corresponding resistances of the elements and resistances at their interfaces.

To determine the electrical contact resistance, two contact resistance values must be determined: electrode-to-workpiece ($R_{ew}$) and workpiece-to-workpiece contact resistance ($R_{ww}$). Two measurements, $R_1$ and $R_2$, are needed to calculate these two contact resistance values. Models for measuring $R_1$ and $R_2$ are depicted in FIGS. 4 and 5. As shown in FIG. 4, two electrodes 14 and one workpiece 16 in series result in a total resistance $R_1$. As shown in FIG. 5, two electrodes 14 and two workpieces 16 in series result in a total resistance $R_2$. $R_1$ and $R_2$ are given by the following equations:

$$R_1 = 2 \times R_e + R_w + 2 \times R_{ew}$$

$$R_2 = 2 \times R_e + 2 \times R_w + 2 \times R_{ew} + R_{ww}$$

where $R_e$ is the bulk resistance of the electrode and $R_w$ is the bulk resistance of the workpiece. From the equation for $R_1$, $R_{ew}$ is given by $$R_{ew} = (R_1 - 2 \times R_e - R_w)/2$$

From the equation for $R_2$, $R_{ww}$ is given by $$R_{ww} = R_2 - 2 \times R_e - 2 \times R_w - 2 \times R_{ew}$$

The bulk resistance of the workpiece $R_w$ is obtained by $$R_w = \frac{\rho_w(T) d_w}{A_w}$$

where $d_w$ is the thickness of a workpiece, $A_w$ is the contact area and $\rho_w(T)$ is the resistivity of a workpiece 16 at temperature T. If the workpieces 16 are sheet metal, $\rho_w(T)$ is interpolated from a standard data table for electrical resistivity of sheet metal (SAE1008 carbon steel). The same equation can be used to obtain the bulk resistance of the electrodes $R_e$. If the electrodes 14 are made from copper, $\rho_e(T)$ can be interpolated from a standard data table for electrical resistivity of pure copper.

A small constant current 46 is applied to the electrodes 14 to determine the contact resistance $R_1$ and $R_2$. For example, the constant current can be supplied by a 2A DC current source. To determine $R_1$ and $R_2$, the voltage drop across and the current flow through the electrodes 14 and workpieces 16 needs to be measured. Two multimeters 48, 50 are applied to the electrodes 14 to obtain the current and voltage measurements. The current source 46 and multimeters 48, 50 are connected to the electrodes 14 through two pairs of 22 AWG solid wire which are welded on the surface of the electrodes 14. Once the current and voltage measurements are found, $R_1$ and $R_2$ can be determined by using Ohm's law (V=IR) and then the contact resistances $R_{ew}$ and $R_{ww}$ can be determined from the above equations. The contact resistivity can be obtained by dividing the contact resistance by a contact layer thickness.

To measure the contact resistance, the workpieces 16 are placed in between the electrodes 14. A desired compressive load is applied. An initial high current is applied to the electrodes 14 and workpieces 16 to break down the contaminant film on the surfaces of the workpieces 16. The high current of 1.2 KA is provided by charging the capacitor 30 in the discharging current circuit by closing the first switch 32 until a desired capacitor voltage is reached. Then, the first switch 32 is opened and the second switch 34 is closed and the capacitor 30 is discharged, supplying a high current through the electrodes 14 and workpieces 16. Lastly, a DC current 46 of 2A is applied to the electrodes 14 and workpieces 16 and the voltage drop across and the current flow through the electrodes 14 and workpieces 16 are recorded for calculating $R_1$ or $R_2$. The contact resistance at electrode-to-workpiece and workpiece-to-workpiece interfaces are determined from the measured $R_1$ and $R_2$. The steps are repeated for each desired compressive load.

While the invention has been described by reference to a certain preferred embodiment, it should be understood that numerous changes could be made within the spirit and scope of the inventive concepts described. Accordingly it is intended that the invention not be limited to the disclosed embodiment, but that it have the full scope permitted by the language of the following claims.

What is claimed is:

1. A method for measuring electrical contact resistance at electrode-to-workpiece and workpiece-to-workpiece interfaces in resistance spot welding simulation, comprising the steps of:

maintaining electrodes and workpieces at a constant temperature;

applying a constant compressive load through the electrodes and workpieces to simulate a load applied during an actual resistance spot welding process;

applying a high current to the workpieces to break down contaminant films on surfaces of the workpieces;

applying a small current through the electrodes and workpieces; and measuring the contact resistance at electrode-to-workpiece and workpiece-to-workpiece interfaces.

2. A method as in claim 1 wherein the step of applying a high current to workpieces includes the steps of:

charging at least one capacitor in a discharging current circuit from a power source until the capacitors can provide a high current through the electrodes and workpieces; and discharging the high current from the capacitor through the electrodes and workpieces to break down said contaminant films on the surfaces of the workpieces.

3. A method as in claim 1 wherein the step of applying a small current through the electrodes and workpieces includes the step of measuring the voltage drop across and the current flow through the electrodes and workpieces.

4. A method as in claim 1 wherein the capacitor is charged by closing a first switch within the discharging current circuit.

5. A method as in claim 1 wherein the capacitor is discharged by opening the first switch and closing a second switch which fires a high current switch allowing the high current to flow through the electrodes and workpieces to break down said contaminant films on the surfaces of the workpieces.

6. An apparatus for measuring the electrical contact resistance at electrode-to-workpiece and workpiece-to-workpiece interfaces for resistance spot welding simulation comprising:

loading means to apply compressive load through electrodes and workpieces to stimulate a load applied during resistance spot welding;

heating means for heating the electrodes to maintain the electrodes and workpieces at a constant temperature;

cooling means located beneath the electrodes to cool the electrodes and increase the temperature gradient;

a discharging current circuit connected between the electrodes to provide a high current through the electrodes and workpieces to break down contaminant films on surfaces of the workpieces; and a small constant current source connected to the electrodes to supply a constant current flow through the electrodes and workpieces to allow the contact resistance of the electrodes and workpieces to be measured.

7. An apparatus as in claim 6 wherein the discharging current circuit comprises:

a power supply connected to first and second switches and said second switch connected to gate of a high current switch; and at least one capacitor connected between the first switch and the high current switch, whereby closing of the first switch connects the power supply to the capacitor, charging the capacitor to a desired voltage and opening of the first switch and closing of the second switch discharges a high current from the capacitor through the high current switch to the electrodes and workpieces breaking down the contaminant films on the surfaces of the electrodes.

* * * * *